United States Patent [19]

Hanahara

[11] 4,358,733
[45] Nov. 9, 1982

[54] SPECTRUM ANALYZER WITHOUT DISTINCT BAND-PASS FILTER COMPONENTS

[75] Inventor: Keishi Hanahara, Yamato, Japan

[73] Assignee: Fujitsu Limited, Kawasaki, Japan

[21] Appl. No.: 199,648

[22] Filed: Oct. 22, 1980

[30] Foreign Application Priority Data

Oct. 23, 1979 [JP] Japan .................. 54-136890

[51] Int. Cl.³ .................................. G01R 23/16
[52] U.S. Cl. ........................ 324/77 E; 324/77 D
[58] Field of Search .................. 307/105; 328/105; 324/77 D, 77 E, 77 R

[56] References Cited

U.S. PATENT DOCUMENTS

| | | | |
|---|---|---|---|
| 2,851,661 | 9/1958 | Buland | 324/77 E |
| 3,395,345 | 7/1968 | Rader | 324/77 E |
| 3,789,323 | 1/1974 | Andersen et al. | 324/77 E |

Primary Examiner—Michael J. Tokar
Attorney, Agent, or Firm—Staas & Halsey

[57] ABSTRACT

In an n-band spectrum analyzer, separation of frequency bands is performed by n+1 low-pass (or high-pass) filters. The outputs of adjacent low-pass (or high-pass) filters are subtracted. The output of each subtraction circuit is smoothed by an accumulator.

8 Claims, 7 Drawing Figures

SPECTRUM ANALYZER WITHOUT DISTINCT BAND-PASS FILTER COMPONENTS

CROSS-REFERENCE TO RELATED APPLICATION

Foreign priority under 35 U.S.C. S119 is claimed for this application based on Japanese patent application No. 54-136890, filed Oct. 23, 1979, in Japan.

BACKGROUND OF THE INVENTION

For time-resolved spectrum analysis of a voice signal, which is a method of voice information extraction used in voice recognition units and voice analyzers, the vocal frequency range is conventionally divided into channels by means of band-pass filters. The output power of each band-pass filter is rectified and smoothed with a specified time constant, and the output of all the band-pass filters therefore provides a correspondingly time-resolved segmented frequency analysis of the voice data. Such a device requires as many band-pass filters as the number of channels required for voice analysis or voice recognition. Thus, a dozen or more of these expensive band-pass filters may be required.

SUMMARY OF THE INVENTION

This invention is designed for the purpose of eliminating the disadvantages described above. A spectrum analyzer has been provided by using n+1 low cost digital low-pass (or high-pass) filters, rather than n band-pass filters as described above.

It is an object of this invention to provide each single band-pass filter by the parallel connection of a pair of digital low-pass (or high-pass) filters, utilizing the fact that the data actually required for voice spectrum analysis is the power obtained from each channel.

According to the present invention, where a frequency range divided into n adjacent channels is to be analyzed, n+1 digital low-pass (or high-pass) filters are used in place of the n band-pass filters taught by the prior art. In general, a band-pass filter's order (i.e. the order of the transfer function of the filter) is almost twice that of a digital low-pass (or high-pass) filter having a similar frequency cut-off characteristic. According to the present invention, the function of a known band-pass filter can be realized while reducing the filter order to about half of the known order. This is because those of the digital low-pass (or high-pass) filters which are related to two adjacent frequency bands can be used in common for both bands. Therefore, the number of multiplications can be reduced by one half, as compared with the known method where separate band-pass filters are used. Therefore, an economical improvement is made with a specific cost reduction.

DESCRIPTION OF THE PREFERRED EMBODIMENTS

Figure 1:
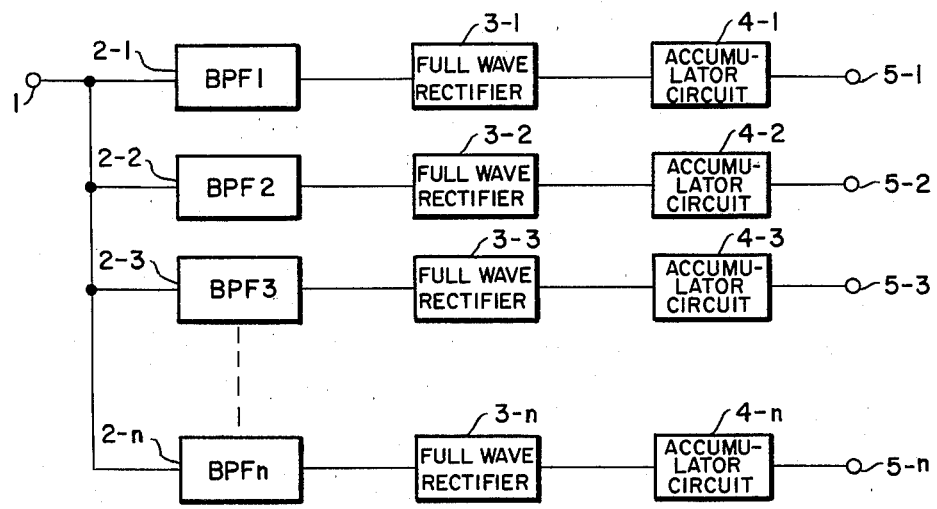
FIG. 1 shows a known spectrum analyzer using band-pass filters.
Figure 2:
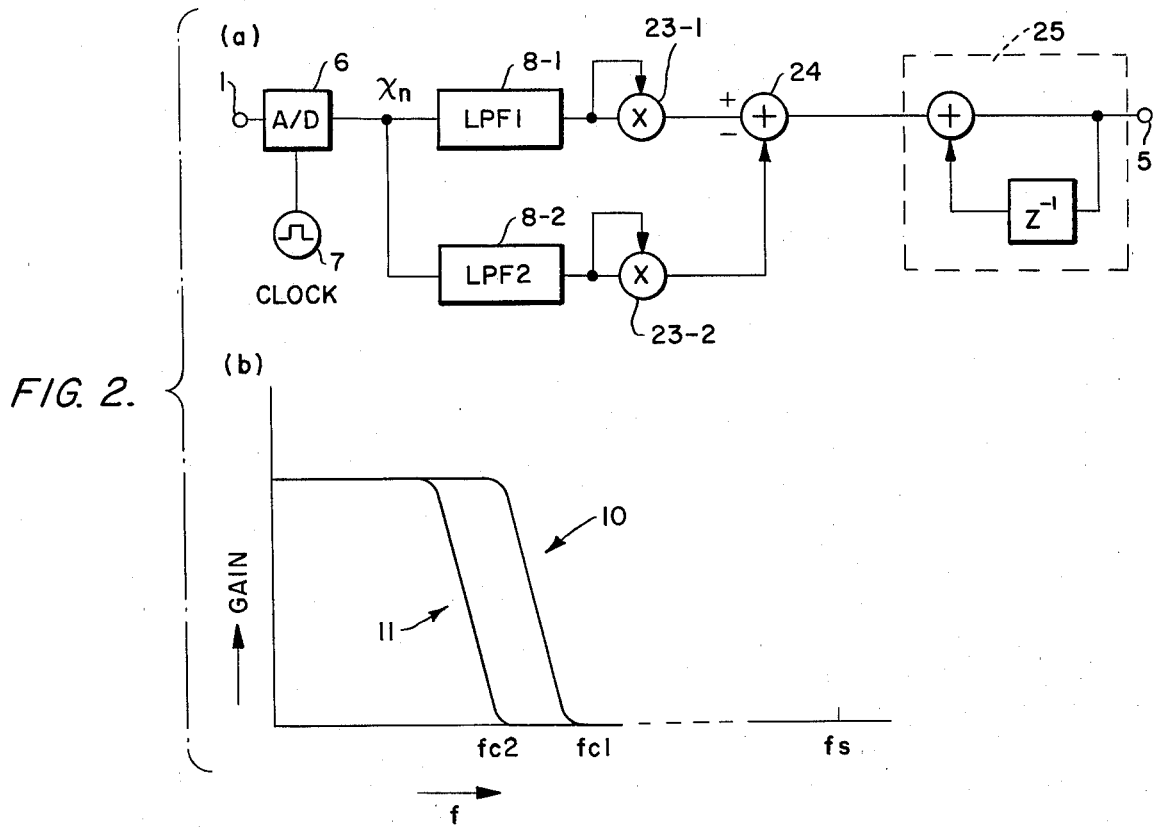
FIG. 2(a) shows a block diagram of a simplified circuit which is useful in explaining the principle of the present invention.
FIG. 2(b) is a graph of the transmission characteristics of the digital low-pass filters used in FIG. 2(a)

The invention will now be explained in detail. FIG. 1 is a block diagram of a known spectrum analyzer.

In the figure, 1 is an input terminal; 2-1 to 2-n are band-pass filters for each channel of continuous voice frequencies; 3-1 to 3-n are full-wave rectifiers; 4-1 to 4-n are accumulator circuits; and 5-1 to 5-n are output terminals for the spectrum analyzed output of each voice channel.

In this figure, the voice signal received at the input terminal 1 is divided into continuous voice channels by the respective band-pass filters 2-1 to 2-n. The frequency of each channel is doubled by the full-wave rectifiers 3-1 to 3-n, and the outputs of these rectifiers are integrated respectively by the integrator circuits 4-1 to 4-n. Thereby, the mean values of spectrum in a certain time interval are the outputs on the output terminals 5-1 to 5-n. Thus, a spectrum analyzer is formed.

As explaind above, this prior art teaching requires one band-pass filter for each channel for the purpose of spectrum analysis of each channel.

Superiority of the novel technique of this invention to the spectrum analyzer of the above-described prior art will be explained with reference to the block diagrams of FIG. 2 to FIG. 6. First, the principle of this invention will be explained by referring to FIGS. 2(a) and 2(b).

In FIG. 2(a), 1 is an input terminal (same as FIG. 1); 5 is an output terminal; 6 is an analog/digital converter (hereinafter referred to as A/D converter); 7 is a clock pulse source for sampling an input signal sent from the input terminal; 8-1 and 8-2 are digital low-pass filters (cut-off frequency $f_{c1}$ and $f_{c2}$); 23-1 and 23-2 are squarer circuits; 24 is a subtraction circuit; 25 is an accumulator which, for example, accumulates the outputs of the subtraction circuit over a time interval of 10 msec, and then outputs the stored value simultaneously with clearing it by a clear pulse. $Z^{-1}$ is a delay circuit.

Curves 10 and 11 of FIG. 2(b) show the transmission characteristics of the digital low-pass filters 8-1 and 8-2 of FIG. 2(a), where $f_s$ is the sampling frequency. The horizontal axis indicates frequency, the vertical axis indicates gain, and $f_{c1}$ and $f_{c2}$ respectively indicate the cut-off frequencies of the digital low-pass filters 8-1 and 8-2.

In FIG. 2(a), the voice signal input from the input terminal 1 is sampled (when a sampling pulse is received from the sampling pulse source) in the A/D converter 6, and is partly inputted to the digital low-pass filter 8-1 which has the transmission characteristic 10 as shown in FIG. 2(b), providing an output of $y_1(n)$. The output of the A/D converter 6 is also inputted to the digital low-pass filter 8-2 having a transmission characteristic 11, providing an output of $y_2(n)$. The respective outputs of the digital low-pass filters 8-1 and 8-2 are squared by the squarer circuits 23-1 and 23-2, and the outputs $y_1(n)^2$, $y_2(n)^2$ are obtained. The outputs of squarer circuits 23-1 and 23-2 are subtracted at the subtraction circuit 24, and the result is inputted to the accumulator 25. Data is accumulated in the accumulator 25 (which is the complete integrator circuit) over a period of 10 msec, and then outputted. Simultaneously, the stored value is cleared. This output value is proportional to the signal energy which has passed the frequency band $f_{c1}$—$f_{c2}$, and its accumulated value is outputted as a measurement of the voice spectrum.

The above result can be explained mathematically as indicated below. The transfer function of a band-pass filter is written as H(z), and the transfer functions of the digital low-pass filters 8-1 and 8-2 are written respectively as $H_1(z)$ and $H_2(z)$. When the z transforms of the band-pass filter input signal series x(n) and the band-pass filter output series y(n) are written as X(z) and Y(z) respectively, the Parseval relation of equation (1) can be obtained.

$$\sum_{n=-\infty}^{\infty} |y(n)|^2 = \frac{1}{2\pi} \int_{-\pi}^{\pi} |Y(e^{j\omega})|^2 d\omega \quad (1)$$

where $\omega = f/f_s$ ($f_s$ is the sampling frequency). See L. Rabiner & P. Gold, *Theory and Application of Digital Signal Processing* (1975); *Applications of Digital Signal Processing* (ed. A. Oppenheim 1978); and L. Rabiner & R. Schafer, *Digital Processing of Speech Signals* (1978), which are hereby incorporated by reference. On the other hand, since Y(z)=H(z).X(z), the equation (1) can be transformed as the equation (2).

$$\sum_{n=-\infty}^{\infty} |y(n)|^2 = \frac{1}{2\pi} \int_{-\pi}^{\pi} |H(e^{j\omega})|^2 \cdot |X(e^{j\omega})|^2 d\omega \quad (2)$$

Here, an ideal band-pass filter and low-pass filter are assumed. Since, $$|H(e^{j\omega})|^2 = |H_1(e^{j\omega})|^2 - |H_2(e^{j\omega})|^2 \quad (3),$$

the equation (2) can be transformed as follows.

$$\sum_{n=-\infty}^{\infty} |y(n)|^2 = \frac{1}{2\pi} \int_{-\pi}^{\pi} |H_1(e^{j\omega})|^2 \cdot |X(e^{j\omega})|^2 d\omega - \quad (4)$$

$$\frac{1}{2\pi} \int_{-\pi}^{\pi} |H_2(e^{j\omega})|^2 \cdot |X(e^{j\omega})|^2 d\omega =$$

$$\sum_{n=-\infty}^{\infty} |y_1(n)|^2 - \sum_{n=-\infty}^{\infty} |y_2(n)|^2 =$$

$$\sum_{n=-\infty}^{\infty} \{|y_1(n)|^2 - |y_2(n)|^2\}$$

The equation (4) corresponds to the block diagram of FIG. 2a.

The structure for realizing the function of n band-pass filters (to be used for the spectrum analyzer) by means of n+1 digital low-pass filters will be explained on the basis of the principle described above. FIG. 3 to FIG. 6 show embodiments of this invention where n band-pass filters are realized as n+1 digital low-pass filters.

Figure 3:
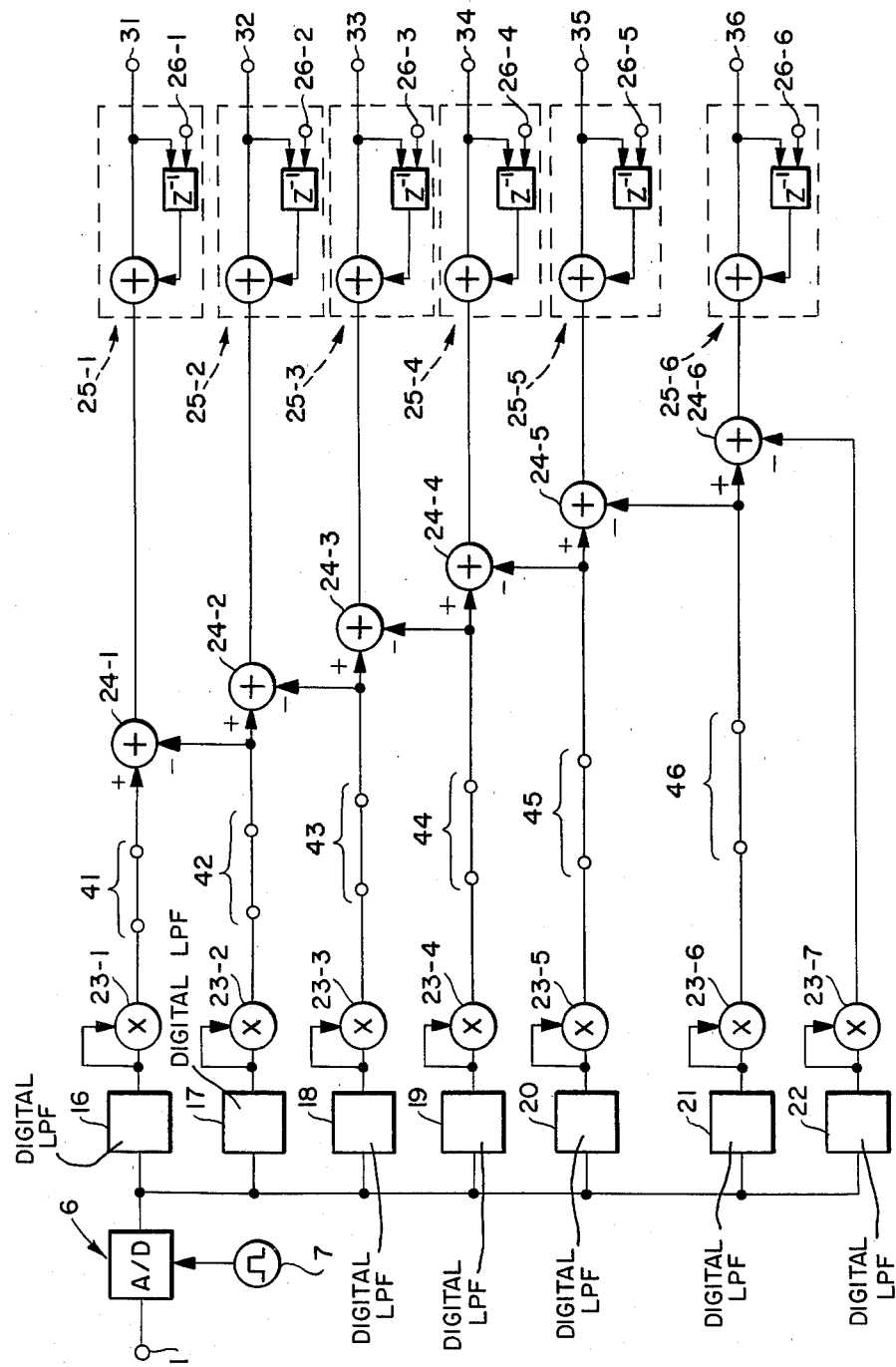
FIG. 3 shows an embodiment of the present invention.
Figure 4:
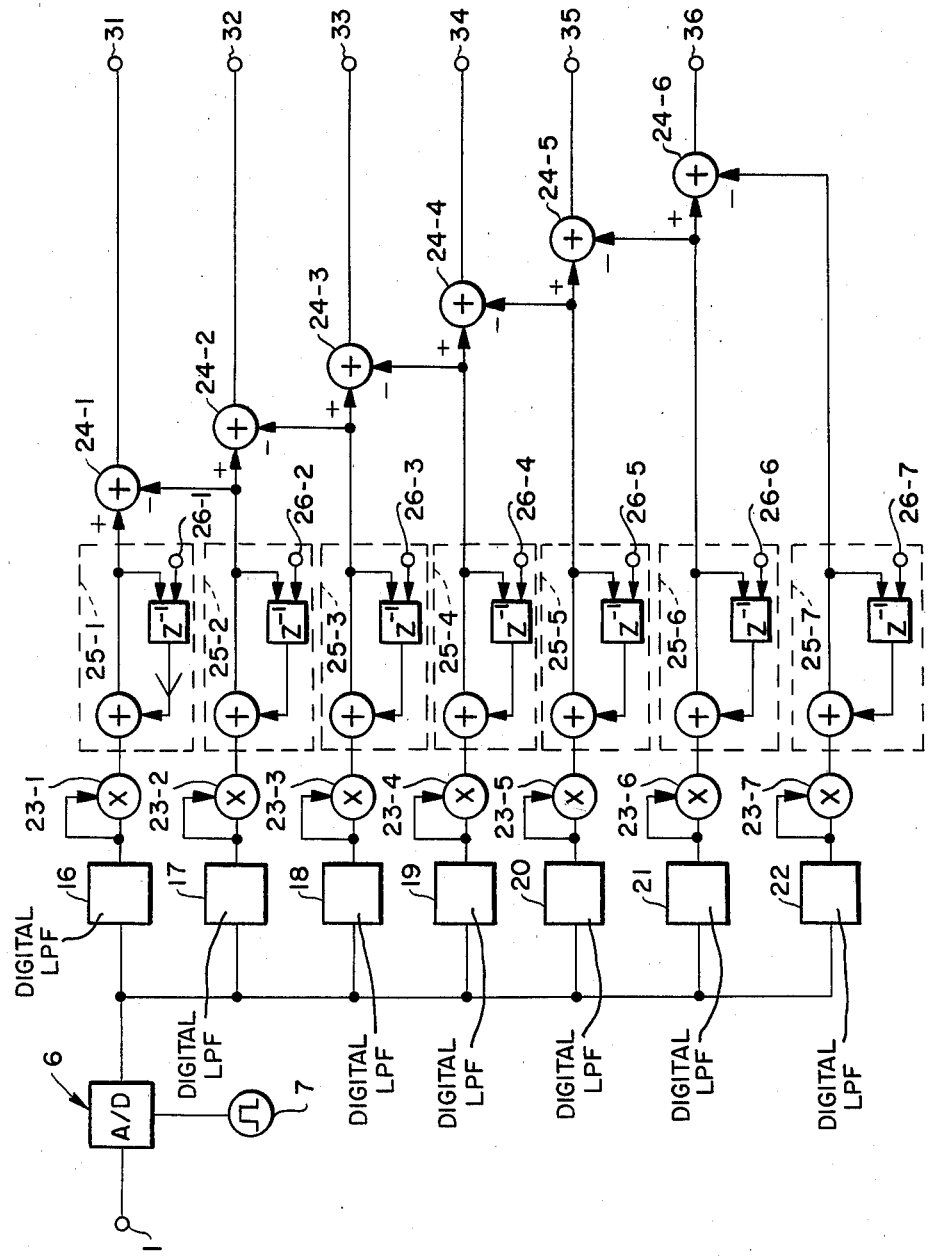
FIG. 4 shows another embodiment of the present invention, which differs from the embodiment of FIG. 3 in that the accumulators 25 have been placed before the subtraction circuits 24 rather than after them.

In FIG. 3, 1 is the input terminal; 6 is the A/D conversion circuit; 7 is the sampling pulse source clock; 16 to 22 are digital low-pass filters; 23-1 to 23-7 are squarer circuits; 24-1 to 24-6 are subtraction circuits; 25-1 to 25-6 are accumulators; 26-1 to 26-6 are input terminals of clear pulses for clearing the previous memory of an accumulator; 31, 32, 34, 35, 36 are outputs; 41, 42, 43, 44, 45, 46 are insertion terminals for inserting the accumulator 25 to this position (preceding stage of the subtraction circuit) as explained in the following discussion of the embodiment of FIG. 4.

In FIG. 4, the accumulators 25-1 to 25-7, which were provided in the stage after the subtraction circuit 24 in FIG. 3, are arranged in the stage before it, and the spectrum analyzer indicated in FIG. 4 offers the same effect as the FIG. 3.

Figure 5:
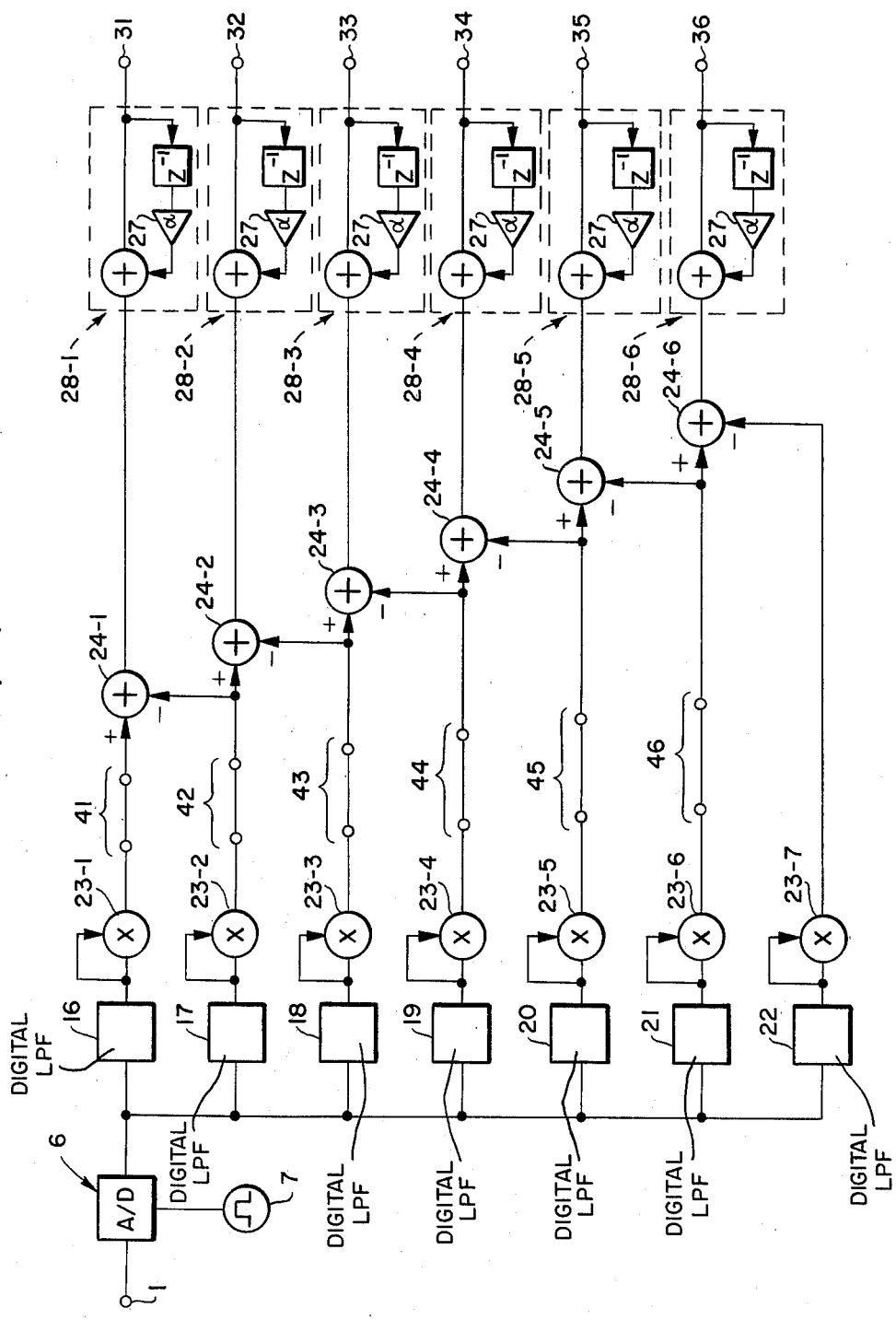
FIG. 5 shows yet another embodiment of the present invention, differing from FIG. 3 in that coefficient circuits 27 have been inserted.

FIG. 5 differs from FIG. 3 in that the accumulators 28-1 to 28-6 include coefficient circuits 27. Thereby, the accumulator becomes an imperfect integrator circuit, so that it is not necessary to clear the preceding data on the occasion of accumulating new data to be input. In this figure, 41 to 46 are insertion terminals used when the accumulator 28 is to be provided in the stage before the subtraction circuit as explained in the following discussion of the embodiment of FIG. 6.

Figure 6:
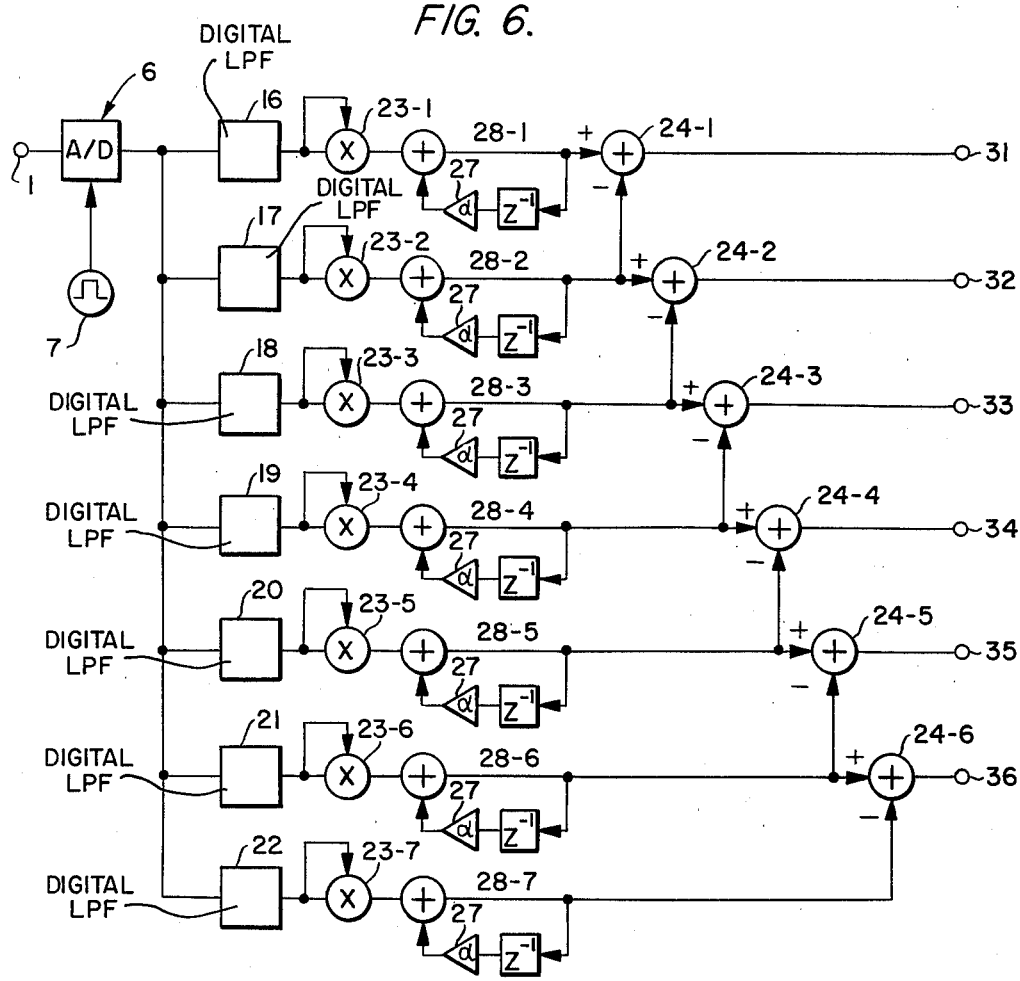
FIG. 6 shows yet another embodiment of the present invention, differing from FIG. 5 in that the accumulators 28 have been placed before the subtraction circuits 24 rather than after them.

In FIG. 6, the accumulators 28-1 to 28-7 of FIG. 5 are provided in the stage before the subtraction circuits 24-1 to 24-6, and this structure has the same effect as the circuit of FIG. 5.

The circuit operation will now be explained. The analog voice signal received at the input terminal 1 of FIG. 3 is converted at the A/D converter 6. The digital output is then inputted to the digital low-pass filters 16 to 22, and filtered outputs $y_1$ to $Y_{n+1}$ are obtained. As in the case of FIG. 2(a), the outputs of digital low-pass filters 16, 17 are respectively inputted to the squarer circuits 23-1 and 23-2. Here, the cut-off frequencies of the digital low-pass filters 16 and 17 are assumed to be $f_{c1}$ and $f_{c2}$. (Refer to FIG. 7.) The outputs of the squarer circuits 23-1 and 23-2 are respectively inputted to the substraction circuit 24-1, and the output of subtraction circuit 24-1 is accumulated, in the same way as explained above, at the accumulator 25-1.

The exact same processing is carried out for the output of digital filters 18 to 22.

Figure 7:
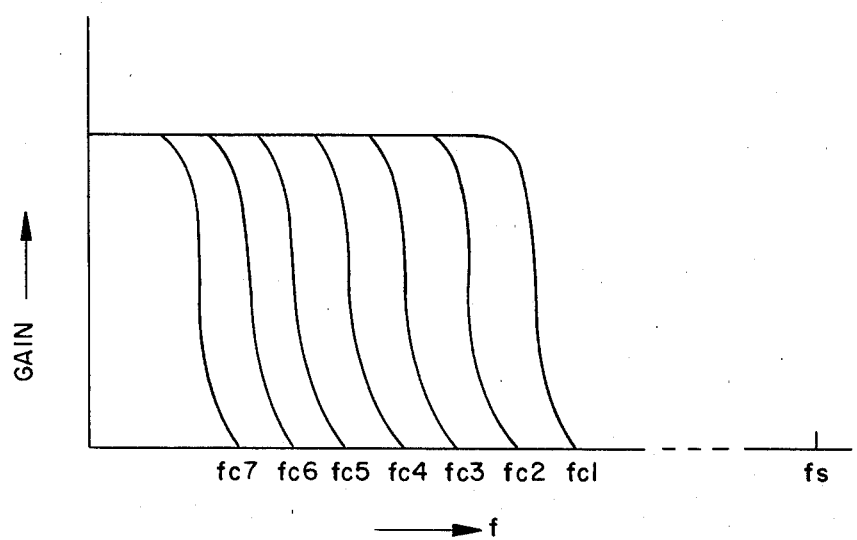
FIG. 7 is a graph indicating the transmission characteristics of the low-pass filters used in the present invention.

In FIG. 7, $f_{c3}$, $f_{c4}$, $f_{c5}$, $f_{c6}$, and $f_{c7}$ are the cut-off frequencies of digital low-pass filters 18 to 22. In case the accumulator is to be provided in the stage before the subtraction circuit, as shown in FIG. 4 and FIG. 6, subtraction is respectively performed after the outputs of squarer circuits are accumulated. In this embodiment, the same output as that of FIG. 3 can also be obtained. It is also apparent that the same output as that of FIG. 3 can be obtained in the embodiment of FIG. 5.

In the above explanation, a digital low-pass filter is referred to, but a digital high-pass filter can also be used. The subtraction processing when a digital high-pass filter is used will be explained using FIG. 7. An output of the filter having a cut-off frequecny $f_{c6}$ is subtracted from the output of the filter having a cut-off frequency $f_{c7}$. In addition, an output of the filter having the cut-off frequency $f_{c5}$ is subtracted from the output of the filter having the cut-off frequency $f_{c6}$. In this way, the output of the filter having the higher cut-off frequency is subtracted from the output of the filter having the lower cut-off frequency. Thereafter, it is recommended to accumulate the data by the accumulator. As explained above, according to this invention, it is possible to offer a small economic spectrum analyzer by using an economical low-pass filter or high-pass filter which has a small number of orders.

It will be apparent to those skilled in the art that various additions and modifications may be made to the embodiments disclosed above. The above embodiments are illustrative only and are not intended to limit the scope of the broad inventive concept sought to be protected by the present application.

What is claimed is:

1. A device comprising:
    a plurality of filters each having separate single cut-off frequencies, said filters being arranged according to said cut-off frequencies;
    a plurality of squarers, each said squarer being operatively connected to a corresponding one of said filters;
    a plurality of subtraction circuits, each subtraction circuit having an output and having positive and negative inputs respectively, operatively connected to two corresponding adjacent ones of said squarers; and
    a plurality of accumulators, each of said plurality of accumulators being operatively connected to said output of a respective one of said subtraction circuits.

2. The device of claim 1 wherein each of said filters is a digital filter, and further comprising: an input terminal; and an analog/digital converter, operatively connected to said input terminal and to all of said filters.

3. The device of claim 2, wherein said analog/digital converter further comprises means for receiving a clock pulse, said analog/digital converter being adapted to convert the voltage of said input terminal at each said clock pulse.

4. The device of claim 3, wherein each said accumulator further comprises means for clearing said accumulator.

5. The device of claim 4, wherein said means for clearing each said accumulator comprises an inverter connected across said accumulator, said inverter being selectively operable.

6. The device of claim 3, wherein each said accumulator further comprises means for clearing said accumulators.

7. The device of claim 6, wherein said means for clearing said accumulators comprises an inverter connected across said accumulator, said inverter being selectively actuable.

8. The device of claim 3, further comprising a plurality of accumulators respectively connected to said respective outputs of said plurality of subtraction circuits, each said accumulator comprising an output and further comprising an inverter and a coeffecient circuit in series with said inverter, said inverter and said coefficient circuit being connected across the accumulator.

* * * * *

UNITED STATES PATENT AND TRADEMARK OFFICE
CERTIFICATE OF CORRECTION

PATENT NO. : 4,358,733

DATED : November 9, 1982

INVENTOR(S) : Hanahara

It is certified that error appears in the above-identified patent and that said Letters Patent is hereby corrected as shown below:

Col. 2, line 30, "spectrumin" should be
--spectrum in--.

Col. 4, line 56, "frequecny" should be --frequency--.

Signed and Sealed this

Twenty-ninth Day of March 1983

[SEAL]

Attest:

GERALD J. MOSSINGHOFF

Attesting Officer

Commissioner of Patents and Trademarks